(12) United States Patent
Kitsukawa et al.

(10) Patent No.: US 9,693,492 B2
(45) Date of Patent: Jun. 27, 2017

(54) HIGH-FREQUENCY PACKAGE

(75) Inventors: Yusuke Kitsukawa, Tokyo (JP);
Takuya Suzuki, Tokyo (JP); Tomoyuki Unno, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 102 days.

(21) Appl. No.: 14/111,107

(22) PCT Filed: Jan. 31, 2012

(86) PCT No.: PCT/JP2012/052117
§ 371 (c)(1),
(2), (4) Date: Oct. 10, 2013

(87) PCT Pub. No.: WO2012/140934
PCT Pub. Date: Oct. 18, 2012

(65) Prior Publication Data
US 2014/0085858 A1    Mar. 27, 2014

(30) Foreign Application Priority Data

Apr. 14, 2011  (JP) ................................ 2011-090259

(51) Int. Cl.
*H05K 1/11*    (2006.01)
*H05K 1/14*    (2006.01)
(Continued)

(52) U.S. Cl.
CPC ............ *H05K 9/006* (2013.01); *H01L 23/04* (2013.01); *H01L 23/552* (2013.01); *H01L 23/66* (2013.01);
(Continued)

(58) Field of Classification Search
CPC ...... H05K 9/0032; H05K 3/429; H05K 1/162; H05K 1/10298; G06F 1/162; H01L 2924/01078
(Continued)

(56) References Cited

U.S. PATENT DOCUMENTS 5,869,894 A    2/1999  Degani et al.
6,137,693 A    10/2000 Schwiebert et al.
(Continued)

FOREIGN PATENT DOCUMENTS

CN    101317268 A    12/2008
CN    101351399 A    1/2009
(Continued)

OTHER PUBLICATIONS

Japanese Office Action issued Sep. 16, 2014 in Patent Application No. 2013-509810 with English Translation.
(Continued)

*Primary Examiner* — Tuan T Dinh
(74) *Attorney, Agent, or Firm* — Oblon, McClelland, Maier & Neustadt, L.L.P.

(57) ABSTRACT

A high-frequency package includes a first dielectric substrate having a signal line and a grounding conductor provided on a back side, a high-frequency element connected to a back side of the first dielectric substrate with a first connection conductor therebetween, a second dielectric substrate having a signal line and a grounding conductor provided on a front side facing the back side with the high-frequency element therebetween, and second connection conductors that are arranged so as to surround the high-frequency element and connect the grounding conductor on the back side of the first dielectric substrate and the grounding conductor on the front side of the second dielectric substrate. In the high-frequency package, a dielectric
(Continued)

space surrounded by a conductor pattern is formed in the front side of the second dielectric substrate under the high-frequency element.

1 Claim, 2 Drawing Sheets

(51) Int. Cl.
*H05K 9/00* (2006.01)
*H01L 23/04* (2006.01)
*H01L 23/552* (2006.01)
*H01L 23/66* (2006.01)

(52) U.S. Cl.
CPC ............ *H01L 2224/16225* (2013.01); *H01L 2924/15192* (2013.01); *H01L 2924/15321* (2013.01)

(58) Field of Classification Search
USPC ........ 361/760–764, 767–785, 803, 792–795; 257/668–692, 728–730
See application file for complete search history.

(56) References Cited

U.S. PATENT DOCUMENTS

| | | | | |
|---|---|---|---|---|
| 6,232,660 | B1* | 5/2001 | Kakimoto et al. | 257/728 |
| 6,297,551 | B1 | 10/2001 | Dudderar et al. | |
| 6,998,292 | B2* | 2/2006 | McDonough et al. | 438/107 |
| 7,514,774 | B2* | 4/2009 | Leung | H01L 23/5385 |
| | | | | 257/668 |
| 7,782,624 | B2* | 8/2010 | Fujii | H01L 23/3128 |
| | | | | 257/686 |
| 2003/0017646 | A1 | 1/2003 | Sridharan et al. | |
| 2005/0006745 | A1* | 1/2005 | Nishimura | H01L 25/105 |
| | | | | 257/686 |
| 2005/0168961 | A1* | 8/2005 | Ono | H01L 23/5385 |
| | | | | 361/784 |
| 2008/0067656 | A1 | 3/2008 | Leung et al. | |
| 2009/0091018 | A1 | 4/2009 | Maeda et al. | |
| 2011/0163919 | A1 | 7/2011 | Suzuki | |
| 2011/0175793 | A1 | 7/2011 | Suzuki | |

FOREIGN PATENT DOCUMENTS

| | | |
|---|---|---|
| JP | 11-87549 A | 3/1999 |
| JP | 2001 135775 | 5/2001 |
| JP | 2003 163304 | 6/2003 |
| JP | 2006 210530 | 8/2006 |
| JP | 2010 258137 | 11/2010 |
| WO | 2007 058280 | 5/2007 |
| WO | 2010 026990 | 3/2010 |

OTHER PUBLICATIONS

International Search Report Issued Mar. 13, 2012 in PCT/JP12/052117 Filed Jan. 31, 2012.
The Extended European Search Report issued Aug. 29, 2014, in Application No. / Pat. No. 12771789.0-1552 / 2698819.
U.S. Appl. No. 14/720,229, filed May 22, 2015, Suzuki.
Office Action issued Aug. 5, 2015 in Chinese Patent Application No. 201280017668.6 (with Partial English-language Translation).
Office Action issued Apr. 13, 2016 in Chinese Patent Application No. 201280017668.6 (with Partial English-language Translation).
Combined Office Action and Search Report issued Oct. 17, 2016 in Chinese Patent Application No. 201280017668.6 (with Partial English language translation and English translation of Categories of Cited Documents).
Office Action issued Apr. 12, 2017 in European Patent Application No. 12 771 789.0.

* cited by examiner

DIELECTRIC SPACE IS NOT PRESENT

DIELECTRIC SPACE IS PRESENT

HIGH-FREQUENCY PACKAGE

FIELD

The present invention relates to a high-frequency package.

BACKGROUND

As disclosed, for example, in Patent Literature 1, the configuration of a conventional high-frequency package is composed of a first dielectric substrate having signal lines and grounding conductors on its surface layer on the back side, a high-frequency element mounted on the surface layer on the back side of the first dielectric substrate, a second dielectric substrate having signal lines and grounding conductors on its surface layer on the front side, and connection conductors, wherein the high-frequency element is mounted on the surface layer on the back side of the first dielectric substrate, the high-frequency element is configured such that it is in between the surface layer on the back side of the first dielectric substrate and the surface layer on the front side of the second dielectric substrate, and the connection conductors connect the grounding conductors of the first and second dielectric substrates so as to surround the high-frequency element, thereby having a shielded space.

CITATION LIST

Patent Literature

Patent Literature 1: WO2010/026990

SUMMARY

Technical Problem

However, according to the conventional technology described above, when the size of one side of the high-frequency element is close to half the wavelength of the fundamental frequency, a cavity resonance frequency is generated near the fundamental frequency. Therefore, there is a problem in that when the high-frequency element is an active element, the isolation between terminals cannot be maintained and oscillation occurs.

The present invention is achieved in view of the above and has an object to obtain a high-frequency package with improved isolation between terminals.

Solution to Problem

In order to solve the above problems and achieve the object, the present invention includes a first dielectric substrate having a signal line and a grounding conductor provided on a back side; a high-frequency element that is connected to a back side of a first dielectric substrate with a first connection conductor therebetween; a second dielectric substrate having a signal line and a grounding conductor provided on a front side that faces the back side with the high-frequency element therebetween; and a plurality of second connection conductors that are arranged so as to surround the high-frequency element and connect the grounding conductor on the back side of the first dielectric substrate and the grounding conductor on the front side of the second dielectric substrate, wherein a dielectric space surrounded by a conductor pattern is formed in the front side of the second dielectric substrate and under the high-frequency element.

Advantageous Effects of Invention

According to the present invention, an effect is obtained where a high-frequency package with improved isolation between terminals is obtained.

BRIEF DESCRIPTION OF DRAWINGS

FIG. 3-1 is a diagram illustrating the calculation results of the isolation between terminals in a case where there is no dielectric space.

FIG. 3-2 is a diagram illustrating the calculation results of the isolation between terminals in a case where there is a dielectric space according to the first embodiment of the present invention.

DESCRIPTION OF EMBODIMENTS

Exemplary embodiments of a high-frequency package according to the present invention will be explained below in detail with reference to the drawings. This invention is not limited to the embodiments.

First Embodiment

Figure 1:
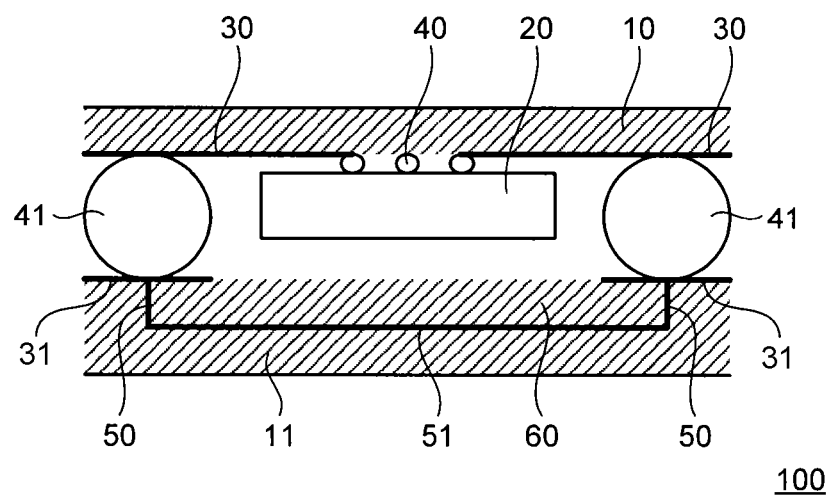
FIG. 1 is a diagram illustrating a circuit configuration of a high-frequency package according to a first embodiment of the present invention.

FIG. 1 is a diagram illustrating a circuit configuration of a high-frequency package 100 according to the first embodiment of the present invention. The high-frequency package 100 includes a first dielectric substrate 10 that includes signal lines and grounding conductors 30 on its surface layer on the back side, a high-frequency element 20 mounted on the first dielectric substrate 10 with connection conductors 40 therebetween, a second dielectric substrate 11 that includes signal lines and grounding conductors 31 on its surface layer on the front side and includes a dielectric space 60 formed by being surrounded by vias 50 and an internal-layer pattern 51, which are formed from conductors, and solder balls 41 that are connection conductors that connect the grounding conductors 30 of the first dielectric substrate 10 and the grounding conductors 31 of the second dielectric substrate 11 with each other.

The operation of the high-frequency package 100 according to the first embodiment will be explained. The high-frequency element 20 is mounted on the first dielectric substrate 10 with the connection conductors 40 therebetween. Moreover, the high-frequency element 20 is surrounded by the first dielectric substrate 10 and the second dielectric substrate 11 such that the high-frequency element 20 is in between the first dielectric substrate 10 and the second dielectric substrate 11 and furthermore, the solder balls 41 connect the grounding conductors 30 of the first dielectric substrate 10 and the grounding conductors 31 of the second dielectric substrate 11 with each other so as to surround the high-frequency element 20, thereby having a shielded space.

In the second dielectric substrate 11, the dielectric space 60 is formed under the high-frequency element 20. The dielectric space 60 is formed by being surrounded by the vias 50 and the internal-layer pattern 51, which are conductors. Therefore, the effective dielectric constant in the shielded space increases by the value of the dielectric constant of the dielectric space 60 and the cavity resonance frequency shifts to a low frequency; therefore, the isolation between terminals is improved.

Figure 2:
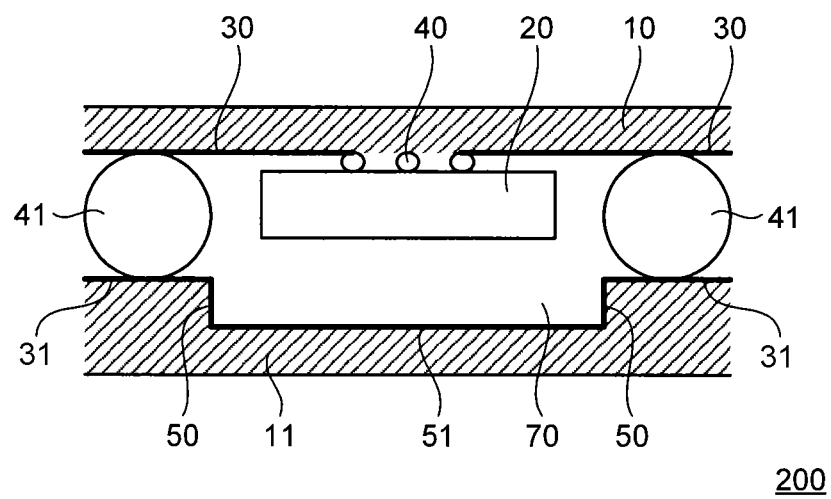
FIG. 2 is a diagram illustrating a circuit configuration of a high-frequency package according to a second embodiment of the present invention.
Figures 1, 3:
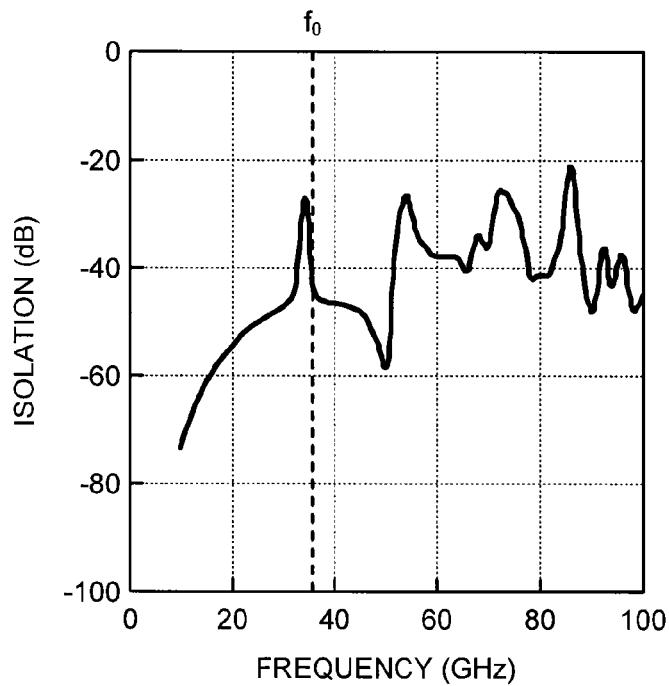
Figures 2, 3:
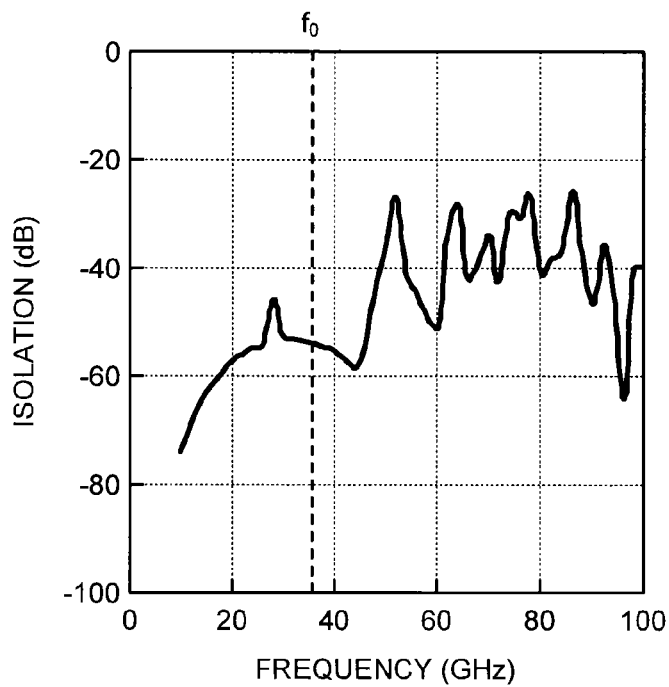

FIG. 3-1 illustrates the calculation results of the isolation between terminals in a case where there is no dielectric space and FIG. 3-2 illustrates the calculation results of the isolation between terminals in a case where there is a dielectric space. By comparing FIG. 3-1 and FIG. 3-2, it is seen that the presence of the dielectric space according to the present embodiment improves the isolation between terminals.

Second Embodiment

FIG. 2 is a diagram illustrating a circuit configuration of a high-frequency package 200 according to the second embodiment of the present invention. The high-frequency package 200 includes the first dielectric substrate 10 that includes signal lines and grounding conductors 30 on its surface layer on the back side, the high-frequency element 20 mounted on the first dielectric substrate 10 with the connection conductors 40 therebetween, the second dielectric substrate 11 that includes signal lines and the grounding conductors 31 on its surface layer on the front side and includes a cavity space 70 surrounded by the vias 50 and the internal-layer pattern 51, which are formed from conductors, and the solder balls 41 that are connection conductors that connect the grounding conductors 30 of the first dielectric substrate 10 and the grounding conductors 31 of the second dielectric substrate 11 with each other.

The operation of the high-frequency package 200 according to the second embodiment will be explained. The high-frequency element 20 is mounted on the first dielectric substrate 10 with the connection conductors 40 therebetween. Moreover, the high-frequency element 20 is surrounded by the first dielectric substrate 10 and the second dielectric substrate 11 such that the high-frequency element 20 is in between the first dielectric substrate 10 and the second dielectric substrate 11 and furthermore, the solder balls 41 connect the grounding conductors 30 of the first dielectric substrate 10 and the grounding conductors 31 of the second dielectric substrate 11 with each other so as to surround the high-frequency element 20, thereby having a shielded space.

In the second dielectric substrate 11, the cavity space 70 is formed under the high-frequency element 20. The cavity space 70 is surrounded by the vias 50 and the internal-layer pattern 51, which are conductors. Therefore, the effective dielectric constant in the shielded space decreases by the value of the dielectric constant of the cavity space 70 and the cavity resonance frequency shifts to a high frequency; therefore, the isolation between terminals is improved.

Furthermore, the present invention is not limited to the above embodiments and can be variously modified at the execution stage without departing from the scope thereof. Moreover, the above-described embodiments include inventions in various stages and various inventions can be extracted by appropriately combining a plurality of disclosed components.

For example, even if several components are omitted from all the components illustrated in each of the above first and second embodiments, a configuration in which the several components are omitted can be extracted as an invention as long as the problem described in the section of Technical Problem can be solved and the effects described in the section of Advantageous Effects of Invention can be obtained. Furthermore, the components in the above-described first and second embodiments may be appropriately combined.

INDUSTRIAL APPLICABILITY

As above, the high-frequency package according to the present invention is useful for isolation between terminals and particularly suitable in a case where the high-frequency element is an active element.

REFERENCE SIGNS LIST 10 first dielectric substrate
11 second dielectric substrate
20 high-frequency element
30 grounding conductors of the first dielectric substrate
31 grounding conductors of the second dielectric substrate
40 connection conductor
41 solder ball
50 via
51 internal-layer pattern
60 dielectric space
70 cavity space
100, 200 high-frequency package

The invention claimed is:

1. A high-frequency package comprising:
a first dielectric substrate including a first planar grounding conductor provided on a back side;
a high-frequency element that is connected to the back side of the first dielectric substrate with a first connection conductor therebetween;
a second dielectric substrate including a second grounding conductor provided on a surface layer around a cavity formed in a front side thereof that faces the back side of the first dielectric substrate with the high-frequency element and a shielded space being sandwiched between the back side of the first dielectric substrate and the front side of the second dielectric substrate; and
a plurality of second connection conductors that connect directly to the first planar grounding conductor and the second grounding conductor so as to surround the high-frequency element with the shielded space therebetween, wherein
a bottom of the cavity faces the high-frequency element and is lined with a conductor pattern, and an inside space of the cavity is used as a dielectric space for shifting a cavity resonance frequency of the shielded space,
the conductor pattern is connected to the second grounding conductor through a via conductor located on an inner side wall of the cavity,
the first planar grounding conductor overlaps the high-frequency element, and
the cavity is covered with the conductor pattern and the via conductor.

* * * * *